(12) United States Patent
Tian et al.

(10) Patent No.: US 10,665,659 B2
(45) Date of Patent: May 26, 2020

(54) DOUBLE-SIDED DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/578,446

(22) PCT Filed: Jun. 26, 2017

(86) PCT No.: PCT/CN2017/090020
§ 371 (c)(1),
(2) Date: Nov. 30, 2017

(87) PCT Pub. No.: WO2018/059028
PCT Pub. Date: Apr. 5, 2018

(65) Prior Publication Data
US 2019/0221629 A1    Jul. 18, 2019

(30) Foreign Application Priority Data
Sep. 30, 2016    (CN) .......................... 2016 1 0875420

(51) Int. Cl.
*H01L 51/52*    (2006.01)
*H01L 27/32*    (2006.01)
*H01L 51/56*    (2006.01)

(52) U.S. Cl.
CPC ...... *H01L 27/3267* (2013.01); *H01L 27/3248* (2013.01); *H01L 27/3262* (2013.01);
(Continued)

(58) Field of Classification Search
CPC ............. H01L 27/3267; H01L 27/3248; H01L 27/3262; H01L 51/5206; H01L 51/5221; H01L 51/56; H01L 51/525; H01L 51/5256
See application file for complete search history.

(56) References Cited

U.S. PATENT DOCUMENTS

| 7,586,254 B2 * | 9/2009 | Kwak .................. G09G 3/3233 257/88 |
| 9,293,515 B2 | 3/2016 | Choi et al. |

(Continued)

FOREIGN PATENT DOCUMENTS

| CN | 101729488 A | 6/2010 |
| CN | 102044554 A | 5/2011 |

(Continued)

OTHER PUBLICATIONS

First Office Action for Chinese Application No. 201610875420.3, dated Aug. 14, 2018, 8 Pages.

(Continued)

*Primary Examiner* — Matthew L Reames
(74) *Attorney, Agent, or Firm* — Brooks Kushman P.C.

(57) ABSTRACT

The double-sided display panel according to embodiments of the present disclosure includes: a first organic light-emitting layer for front-side display; a second organic light-emitting layer for back-side display; a first switch TFT configured to enable the first organic light-emitting layer to emit light; and a second switch TFT configured to enable the second organic light-emitting layer to emit light. A gate electrode of the first switch TFT is multiplexed as, or connected to, a gate electrode of the second switch TFT.

14 Claims, 3 Drawing Sheets

(52) U.S. Cl.
CPC ...... *H01L 51/5206* (2013.01); *H01L 51/5221* (2013.01); *H01L 51/56* (2013.01); *H01L 51/525* (2013.01); *H01L 51/5256* (2013.01)

(56) References Cited

U.S. PATENT DOCUMENTS

| | | | |
|---|---|---|---|
| 9,679,919 B2* | 6/2017 | Go | H01L 27/124 |
| 2004/0245531 A1* | 12/2004 | Fuii | H01L 27/3267 |
| | | | 257/88 |
| 2007/0164277 A1 | 7/2007 | Sung et al. | |
| 2013/0200380 A1 | 8/2013 | Chang et al. | |
| 2015/0325630 A1 | 11/2015 | Yoo et al. | |
| 2016/0020263 A1 | 1/2016 | Xu et al. | |
| 2016/0233282 A1 | 8/2016 | Song et al. | |
| 2016/0268347 A1 | 9/2016 | Yan et al. | |

FOREIGN PATENT DOCUMENTS

| | | |
|---|---|---|
| CN | 103247656 A | 8/2013 |
| CN | 103325731 A | 9/2013 |
| CN | 103715228 A | 4/2014 |
| CN | 103730485 A | 4/2014 |
| CN | 103943658 A | 7/2014 |
| CN | 106252383 A | 12/2016 |
| CN | 106711178 A | 5/2017 |

OTHER PUBLICATIONS

International Search Report and Written Opinion for Application No. PCT/CN2017/090020, dated Aug. 30, 2017, 10 Pages.

* cited by examiner

DOUBLE-SIDED DISPLAY PANEL, MANUFACTURING METHOD THEREOF AND DISPLAY DEVICE

CROSS-REFERENCE TO RELATED APPLICATION APPLICATIONS

This application is the U.S. national phase of PCT Application No. PCT/CN2017/090020 filed on Jun. 26, 2017, which claims priority to Chinese Patent Application No. 201610875420.3 filed on Sep. 30, 2016, which are incorporated herein by reference in their entireties.

TECHNICAL FIELD

The present disclosure relates to the field of display technology, in particular to a double-sided display panel, a manufacturing method thereof and a display device.

BACKGROUND

Currently, most of the display devices available in the market are single-sided display devices. In many scenarios, e.g., for digital signage, electronic communication equipment, cashier utilities, window-type inquiry utilities and advertisement playing utilities in such public places as exhibition centers, usually users need to view displayed images/pictures from two sides of the display device. The double-sided display has been widely used nowadays.

However, a conventional double-sided display panel actually includes two separate display panels assembled together, and its internal structure and a driving system for driving the two separate display panels to emit light are complex, so a display synchronization abnormality may occur for the double-sided display device. In addition, the double-sided display panel has relatively high manufacture cost and a large thickness, so it is impossible to provide a light and thin display panel.

SUMMARY

An object of the present disclosure is to provide a double-sided display panel, a manufacturing method thereof and a display device, so as to achieve the synchronization for the double-sided display, effectively reduce a thickness and a volume of the double-sided display panel, and reduce the manufacture cost and power consumption thereof.

In one aspect, the present disclosure provides in some embodiments a double-sided display panel, including: a first organic light-emitting layer for front-side display; a second organic light-emitting layer for back-side display; a first switch thin film transistor (TFT) configured to enable the first organic light-emitting layer to emit light; and a second switch TFT configured to enable the second organic light-emitting layer to emit light. A gate electrode of the first switch TFT is multiplexed as, or connected to, a gate electrode of the second switch TFT.

In a possible embodiment of the present disclosure, the double-sided display panel further includes a substrate. The first organic light-emitting layer is arranged at a first side of the substrate, and the second organic light-emitting layer is at least partially arranged at a second side of the substrate opposite to the first side.

In a possible embodiment of the present disclosure, the double-sided display panel further includes a first anode layer, a first cathode layer, a second anode layer and a second cathode layer. The first organic light-emitting layer is arranged between the first anode layer and the first cathode layer, and the second organic light-emitting layer is arranged between the second anode layer and the second cathode layer.

In a possible embodiment of the present disclosure, the first anode layer, the first cathode layer, the first switch TFT, the second switch TFT and the second anode layer are arranged at the first side of the substrate, the second cathode layer is arranged at the second side of the substrate, the substrate is provided with a cutout region corresponding to the second anode layer, and the second organic light-emitting layer is connected to the second anode layer through the cutout region.

In a possible embodiment of the present disclosure, the double-sided display panel further includes: a first pixel definition layer arranged at a side of the first anode layer away from the substrate and configured to define a first pixel region where the first organic light-emitting layer is located; and a second pixel definition layer arranged at the second side of the substrate and configured to define a second pixel region where the second organic light-emitting layer is located.

In a possible embodiment of the present disclosure, the double-sided display panel further includes: a first packaging layer arranged at a side of the first cathode layer away from the substrate; and a second packaging layer arranged at a side of the second cathode layer away from the substrate.

In a possible embodiment of the present disclosure, each of the first packaging layer and the second packaging layer is a packaging film which includes inorganic films and organic films alternately laminated one on another.

In a possible embodiment of the present disclosure, each of the first packaging layer and the second packaging layer is a packaging substrate, and the double-sided display panel further includes: a first spacer arranged between the first pixel definition layer and the first packaging layer; and a second spacer arranged between the second pixel definition layer and the second packaging layer.

In a possible embodiment of the present disclosure, the substrate is a flexible substrate.

In another aspect, the present disclosure provides in some embodiments a display device including the above-mentioned double-sided display panel.

In yet another aspect, the present disclosure provides in some embodiments a method for manufacturing the above-mentioned double-sided display panel, including steps of: forming a first organic light-emitting layer for front-side display; forming a second organic light-emitting layer for back-side display; forming a first switch TFT configured to enable the first organic light-emitting layer to emit light; and forming a second switch TFT configured to enable the second organic light-emitting layer to emit light. A gate electrode of the first switch TFT is multiplexed as, or connected to, a gate electrode of the second switch TFT.

In a possible embodiment of the present disclosure, the step of forming the first organic light-emitting layer for front-side display includes: providing a hard substrate; forming a flexible substrate on the hard substrate; and forming the first organic light-emitting layer at a first side of the flexible substrate away from the hard substrate. The step of forming the second organic light-emitting layer for back-side display includes: removing the flexible substrate from the hard substrate; and forming at least a part of the second organic light-emitting layer at a second side of the flexible substrate opposite to the first side.

In a possible embodiment of the present disclosure, prior to the step of forming the first organic light-emitting layer at the first side of the flexible substrate away from the hard substrate, the method further includes forming a second anode layer, a second switch TFT, a first switch TFT, a first anode layer and a first pixel definition layer sequentially at the first side of the flexible substrate, the first pixel definition layer being configured to define a first pixel region. The step of forming the first organic light-emitting layer further includes forming the first organic light-emitting layer at the first pixel region. Subsequent to the step of forming the first organic light-emitting layer at the first side of the flexible substrate, the method further includes forming a first cathode layer on the first organic light-emitting layer. Prior to the step of forming at least a part of the second organic light-emitting layer at the second side of the flexible substrate, the method further includes: subjecting the flexible substrate to treatment so as to form a cutout region in the flexible substrate to expose the second anode layer; and forming a second pixel definition layer at the second side of the flexible substrate, the second pixel definition layer being configured to define a second pixel region. The step of forming at least a part of the second organic light-emitting layer further includes forming the second organic light-emitting layer at the second pixel region, the second organic light-emitting layer being connected to the second anode layer through the cutout region. Subsequent to the step of forming at least a part of the second organic light-emitting layer at the second side of the flexible substrate, the method further includes forming a second cathode layer on the second organic light-emitting layer.

In a possible embodiment of the present disclosure, subsequent to the step of forming the first cathode layer, the method further includes forming a first packaging layer at a side of the first cathode layer away from the flexible substrate. Subsequent to the step of forming the second cathode layer, the method further includes forming a second packaging layer at a side of the second cathode layer away from the flexible substrate.

According to the embodiments of the present disclosure, the first organic light-emitting layer for front-side display and the second organic light-emitting layer for back-side display are assembled together, and the gate electrode of the first switch TFT configured to enable the first organic light-emitting layer to emit light is multiplexed as, or connected to, the gate electrode of the second switch TFT configured to enable the second organic light-emitting layer to emit light, so as to achieve the synchronization of the double-sided display, and manufacture the double-sided display panel without affecting, or increasing, the difficulty in a conventional manufacture process. As a result, it is able to effectively reduce a thickness and a volume of the double-sided display panel, reduce the manufacture cost and the power consumption thereof, simplify the design, shorten a production tact of the double-sided display panel, and improve the yield and the display quality of the double-sided display panel, thereby to facilitate the manufacture and promotion of the double-sided display panel.

Figure 1:
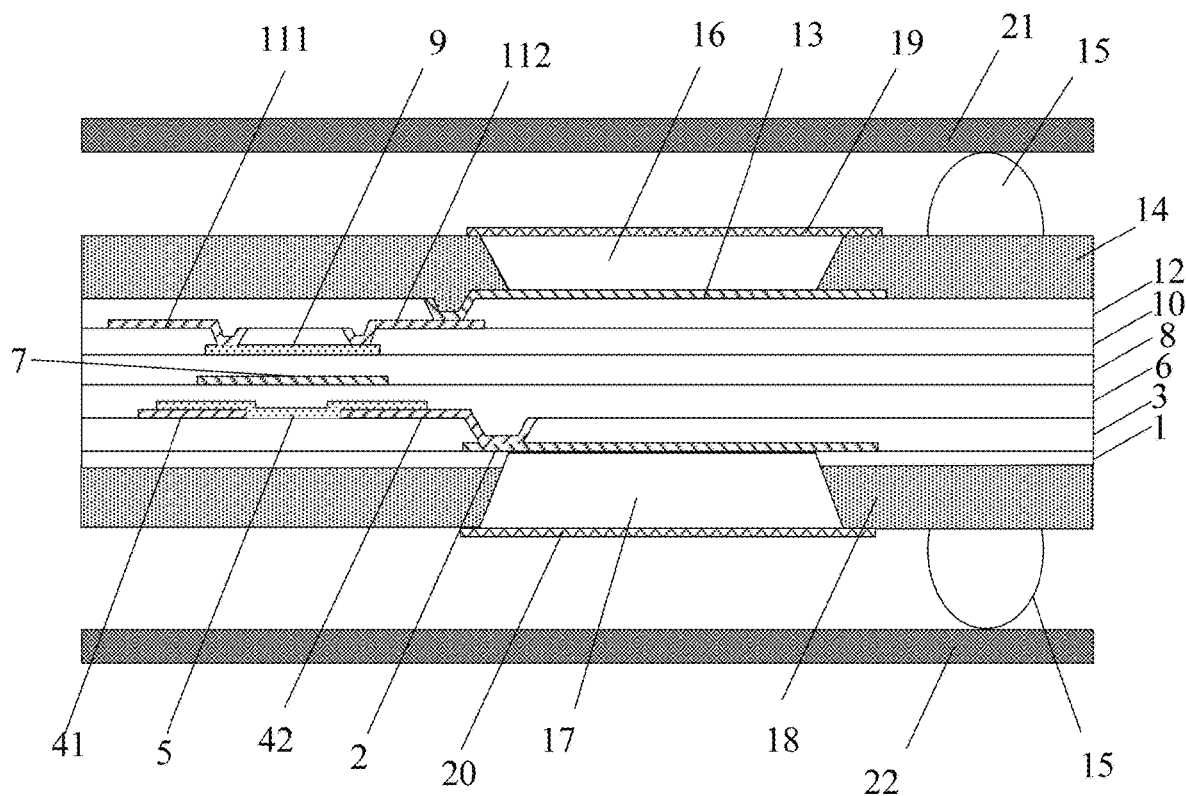
FIG. 1 is a schematic view showing a double-sided display panel according to one embodiment of the present disclosure.

REFERENCE SIGN LIST 1 flexible substrate
2 second anode layer
3 second passivation layer
41 second source electrode
42 second drain electrode
5 second active layer
6 second gate insulation layer
7 gate electrode
71 gate electrode
72 gate electrode
8 first gate insulation layer
9 first active layer
10 etch stop layer
111 first source electrode
112 first drain electrode
12 first passivation layer
13 first anode layer
14 first pixel definition layer
15 spacer
16 first organic light-emitting layer
17 second organic light-emitting layer
18 second pixel definition layer
19 first cathode layer
20 second cathode layer
21 first packaging layer
22 second packaging layer
23 third insulation layer
211 inorganic film
212 organic film
500 display device
501 display panel

DETAILED DESCRIPTION OF THE EMBODIMENTS

The present disclosure will be described hereinafter in conjunction with the drawings and embodiments. The following embodiments are for illustrative purposes only, but shall not be used to limit the scope of the present disclosure.

In the related art, a display synchronization abnormality may occur for a double-sided display panel. In addition, the double-sided display panel has relatively high manufacture cost and a large thickness, so it is impossible to provide a light and thin display panel. An object of the present disclosure is to provide a double-sided display panel, a manufacturing method thereof and a display device, so as to achieve the synchronization for the double-sided display, effectively reduce a thickness and a volume of the double-sided display panel, and reduce the manufacture cost and power consumption thereof.

The present disclosure provides in some embodiments a double-sided display panel, which includes: a first organic light-emitting layer for front-side display; a second organic light-emitting layer for back-side display; a first switch TFT configured to enable the first organic light-emitting layer to emit light; and a second switch TFT configured to enable the second organic light-emitting layer to emit light. A gate electrode of the first switch TFT is multiplexed as, or connected to, a gate electrode of the second switch TFT.

According to the embodiments of the present disclosure, the first organic light-emitting layer for front-side display and the second organic light-emitting layer for back-side display are assembled together (namely integrated), and the gate electrode of the first switch TFT configured to enable the first organic light-emitting layer to emit light is multiplexed as, or connected to, the gate electrode of the second switch TFT configured to enable the second organic light-emitting layer to emit light, so as to achieve the synchronization of the double-sided display, and manufacture the double-sided display panel without affecting, or increasing, the difficulty in a conventional manufacture process. As a result, it is able to effectively reduce a thickness and a volume of the double-sided display panel, reduce the manufacture cost and the power consumption thereof, simplify the design, shorten a production tact of the double-sided display panel, and improve the yield and the display quality of the double-sided display panel, thereby to facilitate the manufacture and promotion of the double-sided display panel.

The double-sided display panel further includes a substrate. The first organic light-emitting layer for front-side display is arranged at a first side of the substrate, and the second organic light-emitting layer for back-side display is at least partially arranged at a second side of the substrate opposite to the first side. Further, the substrate may be a flexible substrate, and at this time, the double-sided display panel may be suitable for flexible display. To be specific, the flexible substrate may be made of polyimide.

The double-sided display panel further includes a first anode layer, a first cathode layer, a second anode layer and a second cathode layer. The first organic light-emitting layer is arranged between the first anode layer and the first cathode layer, and the second organic light-emitting layer is arranged between the second anode layer and the second cathode layer.

In a possible embodiment of the present disclosure, the first anode layer, the first cathode layer, the first switch TFT, the second switch TFT, the second anode layer and the first organic light-emitting layer are arranged at the first side of the substrate, the second cathode layer is arranged at the second side of the substrate, the substrate is provided with a cutout region corresponding to the second anode layer, and the second organic light-emitting layer is connected to the second anode layer through the cutout region.

In a possible embodiment of the present disclosure, the double-sided display panel is an organic light-emitting diode (OLED) display panel, and at this time, it may further include: a first pixel definition layer arranged at a side of the first anode layer away from the substrate and configured to define a first pixel region where the first organic light-emitting layer is located; and a second pixel definition layer arranged at the second side of the substrate and configured to define a second pixel region where the second organic light-emitting layer is located.

In a possible embodiment of the present disclosure, the double-sided display panel further includes: a first packaging layer arranged at a side of the first cathode layer away from the substrate; and a second packaging layer arranged at a side of the second cathode layer away from the substrate.

Further, each of the first packaging layer and the second packaging layer is a packaging film which includes inorganic films and organic films alternately laminated one on another. In this regard, the double-sided display panel may be suitable for flexible display. In addition, due to the packaging film including the inorganic films and the organic films alternately laminated one on another, it is able to provide excellent water resistance and oxygen resistance performance, namely water-proof and oxygen-proof performance.

In the case that the double-sided display panel is not applied to flexible display, each packaging layer may be a packaging substrate. At this time, the double-sided display panel further includes: a first spacer arranged between the first pixel definition layer and the first packaging layer; and a second spacer arranged between the second pixel definition layer and the second packaging layer.

The double-sided display panel will be described hereinafter in more details by taking an OLED display panel as an example. As shown in FIG. 1, the double-sided display panel includes a flexible substrate 1 which may be formed on a hard substrate. The flexible substrate 1 includes a first side and a second side opposite to the first side. A first organic light-emitting layer 16 for front-side display is formed at the first side of the flexible substrate 1. The first organic light-emitting layer 16 is arranged between a first anode layer 13 and a first cathode layer 19, and at a pixel region defined by a first pixel definition layer 14. A first switch TFT is further formed at the first side of the flexible substrate 1 and configured to drive the first organic light-emitting layer 16 to emit light. The first switch TFT includes a gate electrode 7, a first active layer 9, a first gate insulation layer 8, a first source electrode 111 and a first drain electrode 112. A second organic light-emitting layer 17 for back-side display is formed at the second side of the flexible substrate 1. The second organic light-emitting layer 17 is arranged between a second anode layer 2 and a second cathode layer 20, and at a pixel region defined by a second pixel definition layer 18. The second anode layer 2 and the second switch TFT configured to drive the second organic light-emitting layer 17 to emit light are both arranged at the first side of the flexible substrate 1. The second organic light-emitting layer 17 is connected to the second anode layer 2 through a cutout region of the flexible substrate 1. The second switch TFT includes the gate electrode 7, a second source electrode 41, a second drain electrode 42, a second active layer 5 and a second gate insulation layer 6.

It can be seen that, the first switch TFT and the second switch TFT share an identical gate electrode, so it is able to achieve the synchronization of the double-sided display.

The double-sided display panel further includes a first packaging layer 21 arranged at a side of the first cathode layer 19 away from the flexible substrate 1 and a second packaging layer 22 arranged at a side of the second cathode layer 20 away from the flexible substrate 1. In addition, spacers 15 for supporting the first packaging layer 21 and the second packaging layer 22 are arranged on the first pixel definition layer 14 and the second pixel definition layer 18 respectively.

According to the double-sided display panel in the embodiments of the present disclosure, the two organic light-emitting layers are assembled together. As compared with the related art where the double-sided display panel includes two separate display panels, it is able to effectively reduce a thickness and a volume of the double-sided display panel, reduce the manufacture cost and the power consumption thereof, simplify the design, shorten a production tact of the double-sided display panel, and improve the yield and the display quality of the double-sided display panel, thereby to facilitate the manufacture and promotion of the double-sided display panel.

In the embodiments of the present disclosure, in order to facilitate the first switch TFT and the second switch TFT to share an identical gate electrode, the first switch TFT and the second switch TFT may be arranged at an identical side of the flexible substrate. Of course, the first switch TFT and the second switch TFT may also be arranged at different sides of the flexible substrate, as long as the gate electrodes of them may be connected to each other.

In the case that the double-sided display panel in the embodiments of the present disclosure is applied to flexible display, it may be packaged by a packaging film rather than a hard substrate. In the case that the packaging film is used, no spacer may be provided.

The present disclosure further provides in some embodiments a display device including the above-mentioned double-sided display panel. The display device may be any product or member having a display function, such as a television, a display, a digital photo frame, a mobile phone or a flat-panel computer. The display device further includes a flexible circuit board, a printed circuit board and a back plate.

The present disclosure further provides in some embodiments a method for manufacturing the above-mentioned double-sided display panel, which includes steps of: forming a first organic light-emitting layer for front-side display; forming a second organic light-emitting layer for back-side display; forming a first switch TFT configured to enable the first organic light-emitting layer to emit light; and forming a second switch TFT configured to enable the second organic light-emitting layer to emit light. A gate electrode of the first switch TFT is multiplexed as, or connected to, a gate electrode of the second switch TFT.

According to the embodiments of the present disclosure, the first organic light-emitting layer for front-side display and the second organic light-emitting layer for back-side display are assembled together, and the gate electrode of the first switch TFT configured to enable the first organic light-emitting layer to emit light is multiplexed as, or connected to, the gate electrode of the second switch TFT configured to enable the second organic light-emitting layer to emit light, so as to achieve the synchronization of the double-sided display, and manufacture the double-sided display panel without affecting, or increasing, the difficulty in a conventional manufacture process. As a result, it is able to effectively reduce a thickness and a volume of the double-sided display panel, reduce the manufacture cost and the power consumption thereof, simplify the design, shorten a production tact of the double-sided display panel, and improve the yield and the display quality of the double-sided display panel, thereby to facilitate the manufacture and promotion of the double-sided display panel.

To be specific, in the case that the double-sided display panel is applied to flexible display, the first organic light-emitting layer and the second organic light-emitting layer may be formed at different sides of a flexible substrate. The step of forming the first organic light-emitting layer for front-side display includes: providing a hard substrate; forming a flexible substrate on the hard substrate; and forming the first organic light-emitting layer at a first side of the flexible substrate away from the hard substrate. The step of forming the second organic light-emitting layer for back-side display includes: removing the flexible substrate from the hard substrate; and forming at least a part of the second organic light-emitting layer at a second side of the flexible substrate opposite to the first side.

The double-sided display panel further includes a first switch TFT configured to drive the first organic light-emitting layer to emit light, a first anode layer, a first cathode layer, a second switch TFT configured to drive the second organic light-emitting layer to emit light, a second anode layer and a second cathode layer. Prior to the step of forming the first organic light-emitting layer at the first side of the flexible substrate away from the hard substrate, the method further includes forming the second anode layer, the second switch TFT, the first switch TFT, the first anode layer and the first pixel definition layer sequentially at the first side of the flexible substrate, the first pixel definition layer being configured to define a first pixel region. The step of forming the first organic light-emitting layer further includes forming the first organic light-emitting layer at the first pixel region. Subsequent to the step of forming the first organic light-emitting layer at the first side of the flexible substrate, the method further includes forming the first cathode layer on the first organic light-emitting layer. Prior to the step of forming at least a part of the second organic light-emitting layer at the second side of the flexible substrate, the method further includes: subjecting the flexible substrate to treatment so as to form a cutout region in the flexible substrate to expose the second anode layer; and forming a second pixel definition layer at the second side of the flexible substrate, the second pixel definition layer being configured to define a second pixel region. The step of forming at least a part of the second organic light-emitting layer further includes forming the second organic light-emitting layer at the second pixel region, the second organic light-emitting layer being connected to the second anode layer through the cutout region. Subsequent to the step of forming at least a part of the second organic light-emitting layer at the second side of the flexible substrate, the method further includes forming the second cathode layer on the second organic light-emitting layer.

Subsequent to the step of forming the first cathode layer, the method further includes forming a first packaging layer at a side of the first cathode layer away from the flexible substrate. Subsequent to the step of forming the second cathode layer, the method further includes forming a second packaging layer at a side of the second cathode layer away from the flexible substrate.

Figure 2:
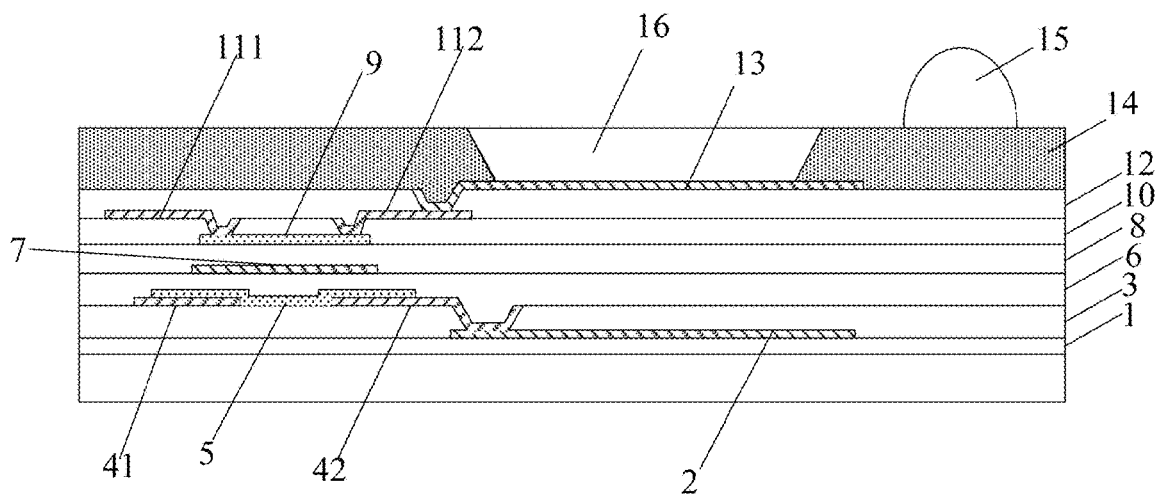
FIG. 2 is another schematic view showing the double-sided display panel during the manufacture according to one embodiment of the present disclosure.

The method will be described hereinafter in conjunction with FIG. 1 and FIG. 2 in the case that the double-sided display panel is an OLED display panel and the packaging layers are each a hard substrate. The method may include the following steps. Step 1: providing a hard substrate which may be a glass substrate or a quartz substrate. Step 2: applying a polyimide film onto the hard substrate which has been cleaned, and curing the polyimide film so as to form the flexible substrate 1 having a thickness smaller than 1000 Å. Step 3: depositing a conductive layer onto the flexible substrate 1, and forming the second anode layer through a patterning process. Step 4: depositing an inorganic material layer onto the flexible substrate 1 acquired after Step 3, and forming a pattern of a second passivation layer 3 with a via-hole through a patterning process. Step 5: depositing a conductive layer onto the second passivation layer, and forming the second source electrode 41 and the second drain electrode 42 through a patterning process. The second drain electrode 42 is connected to the second anode layer 2 through the via-hole in the second passivation layer 3. Step 6: depositing a semiconductor material layer onto the flexible substrate 1 acquired after Step 5, and forming a pattern of the second active layer 5 through a patterning process. The second active layer 5 is connected to the second source electrode 41 and the second drain electrode 42. The semiconductor material layer may be made of low-temperature poly-silicon. Step 7: depositing an insulation material layer onto the flexible substrate 1 acquired after Step 6, so as to form the second gate insulation layer 6. Step 8: depositing a conductive layer onto the second gate insulation layer 6, and forming a pattern of the gate electrode 7 through a patterning process. The gate electrode 7, the second gate insulation layer 6, the second drain electrode 42, the second source electrode 41 and the second active layer 5 form the second switch TFT. Step 9: depositing an insulation material layer onto the flexible substrate 1 acquired after Step 8, so as form the first gate insulation layer 8. Step 10: depositing a semiconductor material layer onto the first gate insulation layer 8, and forming the first active layer 9 through a patterning process. The semiconductor material layer may be made of low-temperature poly-silicon. Step 11: depositing an insulation material layer onto the flexible substrate 1 acquired after Step 10, and forming a pattern of an etch stop layer 10 with a via-hole through a patterning process. Step 12: depositing a conductive layer onto the etch stop layer 10, and forming patterns of the first source electrode 111 and the first drain electrode 112 through a patterning process. The first source electrode 111 and the first drain electrode 112 are connected to the first active layer 9 through the via-hole in the etch stop layer 10. Step 13: depositing an insulation material layer onto the flexible substrate 1 acquired after Step 12, and forming a pattern of the first passivation layer 12 with a via-hole through a patterning process. Step 14: depositing a conductive material layer onto the first passivation layer 12, and forming the first anode layer 13 through a patterning process. Step 15: forming the first pixel definition layer 14 on the flexible substrate 1 acquired after Step 14. Step 16: forming the spacer 15 for supporting the first packaging layer 21 on the first pixel definition layer 14. Step 17: forming the first organic light-emitting layer 16 at the pixel region defined by the first pixel definition layer 14. Step 18: attaching the first packaging layer, so as to package a resultant display member onto the first side of the flexible substrate 1. Step 19: removing the display member from the hard substrate. Step 20: turning over (i.e., inversing) the display member, and subjecting the flexible substrate 1 to treatment, so as to expose the second anode layer 2. Step 22: forming the second pixel definition layer 18 on the flexible substrate 1 acquired after Step 20. Step 23: forming the spacer 15 for supporting the second packaging layer 22 on the second pixel definition layer 18. Step 24: forming the second organic light-emitting layer 17 at the pixel region defined by the second pixel definition layer 18. Step 25: attaching the second packaging layer 22, so as to package a resultant display member onto the second side of the flexible substrate 1.

The double-sided display panel may be acquired through the above Steps 1 to 25. In the case that the double-sided display panel is applied to flexible display, it may be packaged using a packaging film rather than the hard substrate. In the case that the packaging film is used, no spacer may be provided.

Figure 3:
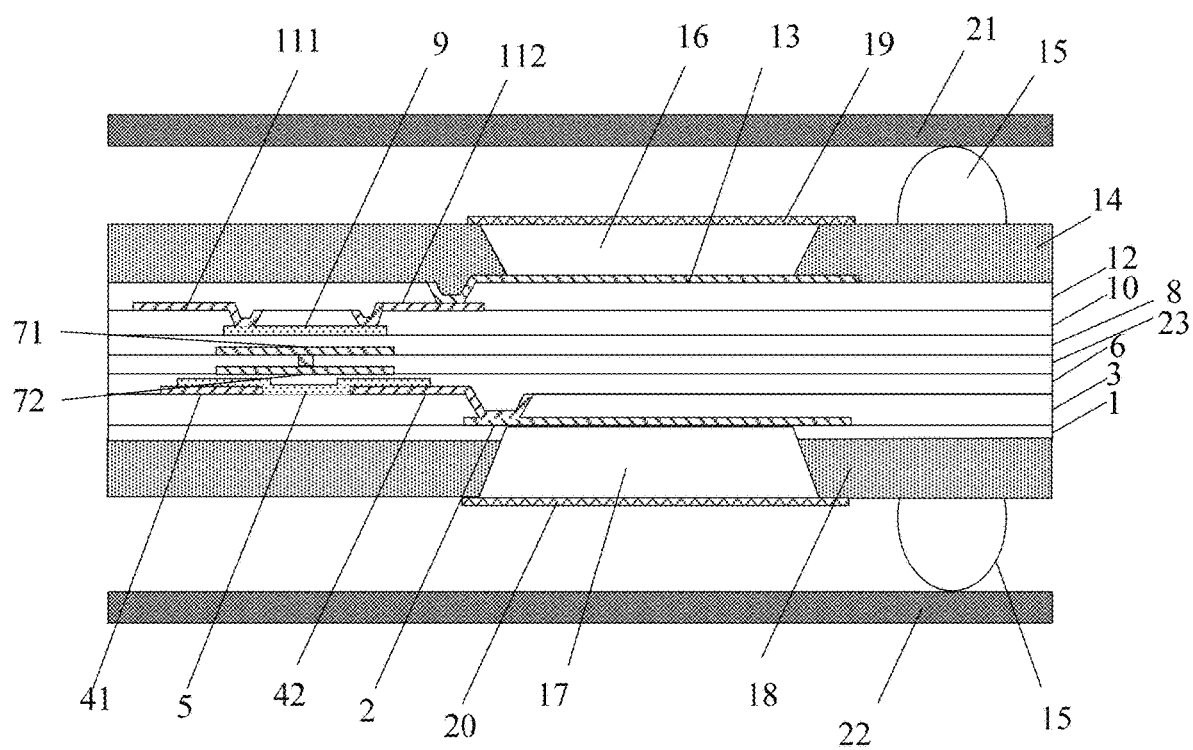
FIG. 3 is yet another schematic view showing the double-sided display panel according to one embodiment of the present disclosure.

FIG. 3 is another schematic view showing the double-sided display panel according to the embodiments of the present disclosure. The double-sided display panel in FIG. 3 differs from that in FIG. 1 merely in that a gate electrode 71 of the first switch TFT is connected to a gate electrode 72 of the second switch TFT and a third gate insulation layer 23 is arranged between the gate electrode 71 and the gate electrode 72.

Figure 4:
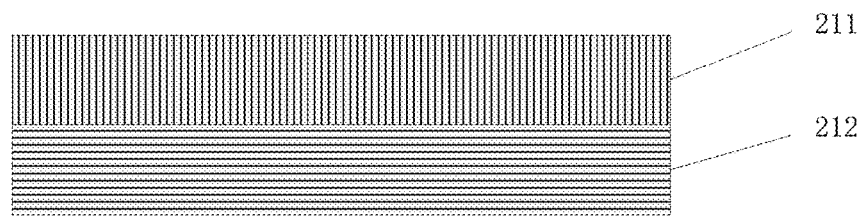
FIG. 4 is a schematic view showing a first packaging layer according to one embodiment of the present disclosure.

FIG. 4 is a schematic view showing the first packaging layer 21 according to the embodiments of the present disclosure. The first packaging layer is a packaging film, and includes inorganic films 211 and organic films 212 alternately laminated one on another. Although in FIG. 4 the first packaging layer 21 merely includes one inorganic film and one organic film, it should be appreciated that, the first packaging layer 21 may include at least one inorganic film and at least one organic film, and the number of the inorganic films and the organic films will not be particularly defined herein. The second packaging film may include the inorganic films and organic films having a number identical to or different from that of the first packaging film.

Figure 5:
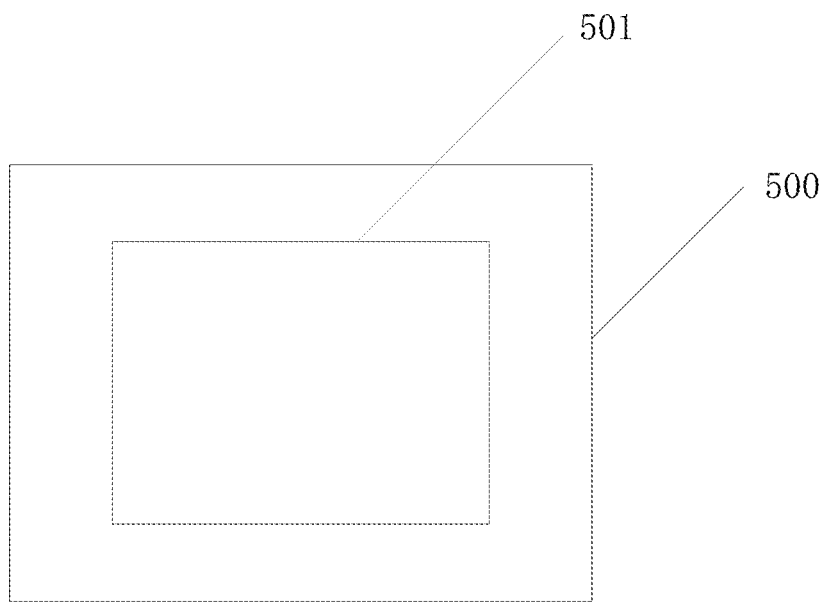
FIG. 5 is a schematic view showing a display device according to one embodiment of the present disclosure.

FIG. 5 shows the display device 500 according to the embodiments of the present disclosure, which includes the above-mentioned double-sided display panel 501.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A double-sided display panel, comprising:
   one substrate;
   a first anode layer and a first cathode layer;
   a second anode layer and a second cathode layer;
   a first organic light-emitting layer for front-side display, wherein the first organic light-emitting layer is arranged between the first anode layer and the first cathode layer;
   a second organic light-emitting layer for back-side display, wherein the second organic light-emitting layer is arranged between the second anode layer and the second cathode layer;
   a first switch thin film transistor (TFT) configured to enable the first organic light-emitting layer to emit light; and
   a second switch TFT configured to enable the second organic light-emitting layer to emit light,
   wherein a gate electrode of the first switch TFT and a gate electrode of the second switch TFT share a same electrode;
   wherein the first organic light-emitting layer is arranged at a first side of the one substrate, and the second organic light-emitting layer is at least partially arranged at a second side of the same one substrate opposite to the first side; and
   wherein the first anode layer, the first cathode layer, the first switch TFT, the second switch TFT and the second anode layer are arranged at the first side of the same one substrate, the second cathode layer is arranged at the second side of the same one substrate, the same one substrate is provided with a cutout region corresponding to the second anode layer, and the second organic light-emitting layer is connected to the second anode layer through the cutout region.

2. The double-sided display panel according to claim 1, further comprising:
   a first pixel definition layer arranged at a side of the first anode layer away from the substrate and configured to define a first pixel region where the first organic light-emitting layer is located; and
   a second pixel definition layer arranged at the second side of the substrate and configured to define a second pixel region where the second organic light-emitting layer is located.

3. The double-sided display panel according to claim 2, further comprising:
   a first packaging layer arranged at a side of the first cathode layer away from the substrate; and a second packaging layer arranged at a side of the second cathode layer away from the substrate.

4. The double-sided display panel according to claim 3, wherein each of the first packaging layer and the second packaging layer is a packaging film which comprises inorganic films and organic films alternately laminated one on another.

5. The double-sided display panel according to claim 3, wherein each of the first packaging layer and the second packaging layer is a packaging substrate, and the double-sided display panel further comprises a first spacer arranged between the first pixel definition layer and the first packaging layer, and a second spacer arranged between the second pixel definition layer and the second packaging layer.

6. The double-sided display panel according to claim 1, wherein the substrate is a flexible substrate.

7. A display device, comprising a double-sided display panel,
wherein the double-sided display panel comprises:
one substrate;
a first anode layer and a first cathode layer;
a second anode layer and a second cathode layer;
a first organic light-emitting layer for front-side display, wherein the first organic light-emitting layer is arranged between the first anode layer and the first cathode layer;
a second organic light-emitting layer for back-side display, wherein the second organic light-emitting layer is arranged between the second anode layer and the second cathode layer;
a first switch thin film transistor (TFT) configured to enable the first organic light-emitting layer to emit light; and
a second switch TFT configured to enable the second organic light-emitting layer to emit light,
wherein a gate electrode of the first switch TFT and a gate electrode of the second switch TFT share a same electrode;
wherein the first organic light-emitting layer is arranged at a first side of the one substrate, and the second organic light-emitting layer is at least partially arranged at a second side of the same one substrate opposite to the first side; and
wherein the first anode layer, the first cathode layer, the first switch TFT, the second switch TFT and the second anode layer are arranged at the first side of the same one substrate, the second cathode layer is arranged at the second side of the same one substrate, the same one substrate is provided with a cutout region corresponding to the second anode layer, and the second organic light-emitting layer is connected to the second anode layer through the cutout region.

8. A method for manufacturing a double-sided display panel, comprising steps of:
providing one substrate;
forming a first anode layer and a first cathode layer;
forming a second anode layer and a second cathode layer;
forming a first organic light-emitting layer for front-side display, wherein the first organic light-emitting layer is arranged between the first anode layer and the first cathode layer;
forming a second organic light-emitting layer for back-side display, wherein the second organic light-emitting layer is arranged between the second anode layer and the second cathode layer;
forming a first switch thin film transistor (TFT) configured to enable the first organic light-emitting layer to emit light; and
forming a second switch TFT configured to enable the second organic light-emitting layer to emit light,
wherein a gate electrode of the first switch TFT and a gate electrode of the second switch TFT share a same electrode;
wherein the first organic light-emitting layer is arranged at a first side of the one substrate, and the second organic light-emitting layer is at least partially arranged at a second side of the same one substrate opposite to the first side; and
wherein the first anode layer, the first cathode layer, the first switch TFT, the second switch TFT and the second anode layer are arranged at the first side of the same one substrate, the second cathode layer is arranged at the second side of the same one substrate, the same one substrate is provided with a cutout region corresponding to the second anode layer, and the second organic light-emitting layer is connected to the second anode layer through the cutout region.

9. The display device according to claim 7, wherein the double-sided display panel further comprises:
a first pixel definition layer arranged at a side of the first anode layer away from the substrate and configured to define a first pixel region where the first organic light-emitting layer is located; and
a second pixel definition layer arranged at the second side of the substrate and configured to define a second pixel region where the second organic light-emitting layer is located.

10. The display device according to claim 7, wherein the double-sided display panel further comprises:
a first packaging layer arranged at a side of the first cathode layer away from the substrate; and
a second packaging layer arranged at a side of the second cathode layer away from the substrate.

11. The display device according to claim 7, further comprising: a first packaging layer and a second packaging layer;
wherein each of the first packaging layer and the second packaging layer is a packaging film which comprises inorganic films and organic films alternately laminated one on another,
wherein each of the first packaging layer and the second packaging layer is a packaging substrate, and the double-sided display panel further comprises a first spacer arranged between the first pixel definition layer and the first packaging layer, and a second spacer arranged between the second pixel definition layer and the second packaging layer,
wherein the substrate is a flexible substrate.

12. The method according to claim 8, wherein the step of forming the first organic light-emitting layer for front-side display comprises providing a hard substrate, forming a flexible substrate on the hard substrate, and forming the first organic light-emitting layer at a first side of the flexible substrate away from the hard substrate; and
the step of forming the second organic light-emitting layer for back-side display comprises removing the flexible substrate from the hard substrate, and forming at least a part of the second organic light-emitting layer at a second side of the flexible substrate opposite to the first side.

13. The method according to claim 12, wherein prior to the step of forming the first organic light-emitting layer at the first side of the flexible substrate away from the hard substrate, the method further comprises forming a second anode layer, a second switch TFT, a first switch TFT, a first anode layer and a first pixel definition layer sequentially at the first side of the flexible substrate, and wherein the first pixel definition layer is configured to define a first pixel region;

the step of forming the first organic light-emitting layer further comprises forming the first organic light-emitting layer at the first pixel region;

subsequent to the step of forming the first organic light-emitting layer at the first side of the flexible substrate, the method further comprises forming a first cathode layer on the first organic light-emitting layer;

prior to the step of forming at least a part of the second organic light-emitting layer at the second side of the flexible substrate, the method further comprises subjecting the flexible substrate to treatment so as to form a cutout region in the flexible substrate to expose the second anode layer, and forming a second pixel definition layer at the second side of the flexible substrate, and wherein the second pixel definition layer is configured to define a second pixel region;

the step of forming at least a part of the second organic light-emitting layer further comprises forming the second organic light-emitting layer at the second pixel region, the second organic light-emitting layer being connected to the second anode layer through the cutout region; and subsequent to the step of forming at least a part of the second organic light-emitting layer at the second side of the flexible substrate, the method further comprises forming a second cathode layer on the second organic light-emitting layer.

14. The method according to claim 13, wherein subsequent to the step of forming the first cathode layer, the method further comprises forming a first packaging layer at a side of the first cathode layer away from the flexible substrate; and subsequent to the step of forming the second cathode layer, the method further comprises forming a second packaging layer at a side of the second cathode layer away from the flexible substrate.

* * * * *